US005457990A

United States Patent [19]
Oswald et al.

[11] Patent Number: 5,457,990
[45] Date of Patent: Oct. 17, 1995

[54] METHOD AND APPARATUS FOR DETERMINING A FLUID LEVEL IN THE VICINITY OF A TRANSMISSION LINE

[75] Inventors: Gordon K. A. Oswald, Colne; Per A. V. Uisi, Ely; Elizabeth A. Orme, Barrington; Thomas W. J. Lawrence, Cambridge, all of United Kingdom

[73] Assignee: Cambridge Consultants Limited, Cambridge, England

[21] Appl. No.: 245,016

[22] Filed: May 18, 1994

Related U.S. Application Data

[63] Continuation of Ser. No. 153,483, Nov. 16, 1993, abandoned, which is a continuation of Ser. No. 878,754, May 5, 1992, abandoned, which is a continuation-in-part of Ser. No. 777,383, Dec. 3, 1991, abandoned.

[51] Int. Cl.⁶ ..................................................... G01F 23/28
[52] U.S. Cl. ..................... 73/290 V; 73/290 R; 324/642; 324/644
[58] Field of Search ............................. 73/290 R, 290 V; 324/642, 644

[56] References Cited

U.S. PATENT DOCUMENTS

| | | | |
|---|---|---|---|
| 3,474,337 | 10/1969 | Petrick | 324/644 |
| 3,517,306 | 6/1970 | Anderson et al. | 324/533 |
| 3,695,107 | 10/1972 | Hertz et al. | 73/290 R |
| 3,812,422 | 5/1974 | De Carolis | 324/642 |
| 3,995,212 | 11/1976 | Ross | 73/290 R X |
| 4,005,363 | 1/1977 | Mifflin . | |
| 4,110,684 | 8/1978 | Gale | 324/522 |
| 4,135,397 | 1/1979 | Krake | 73/290 R |
| 4,165,482 | 8/1979 | Gale | 324/523 |
| 4,208,626 | 6/1980 | Gregg, Jr. . | |
| 4,491,782 | 1/1985 | Bellis et al. | 324/533 |
| 4,527,113 | 7/1985 | Hillerich . | |
| 4,766,549 | 8/1988 | Schweitzer, III et al. | 324/533 |
| 4,797,621 | 1/1989 | Anderson et al. | 324/533 |
| 4,797,621 | 1/1989 | Anderson et al. | 324/533 |

FOREIGN PATENT DOCUMENTS

| | | | |
|---|---|---|---|
| 3016223 | 11/1980 | Germany . | |
| 3533479 | 3/1987 | Germany . | |
| 0026239 | 2/1983 | Japan | 324/644 |
| 0003571 | 1/1989 | Japan | 324/642 |
| 1537748 | 1/1979 | United Kingdom . | |

OTHER PUBLICATIONS

Gerharz: "Wire-guided transients as remote sensing agents for material objects"—Int. Journal Electronics—May 1977—pp. 449–455.

Primary Examiner—Thomas B. Will
Assistant Examiner—Willie Morris Worth
Attorney, Agent, or Firm—Lee, Mann, Smith, McWilliams, Sweeney & Ohlson

[57] ABSTRACT

A method and apparatus for detecting fluid level in a tank in the vicinity of a transmission line (1), the fluid level being such as to cause reflection of a signal transmitted along the transmission line. The method includes the steps of:

a) transmitting a signal along the transmission line;
b) monitoring the transmission line for any reflections of the signal;
c) generating an analysis window of time ($t_1$, $t_2$, $t_3$) if the magnitude of a given characteristic of the reflected signal is greater than a predetermined threshold value; and
d) analyzing the reflected signal received during the period of an analysis window to provide the required information on the fluid level.

15 Claims, 8 Drawing Sheets

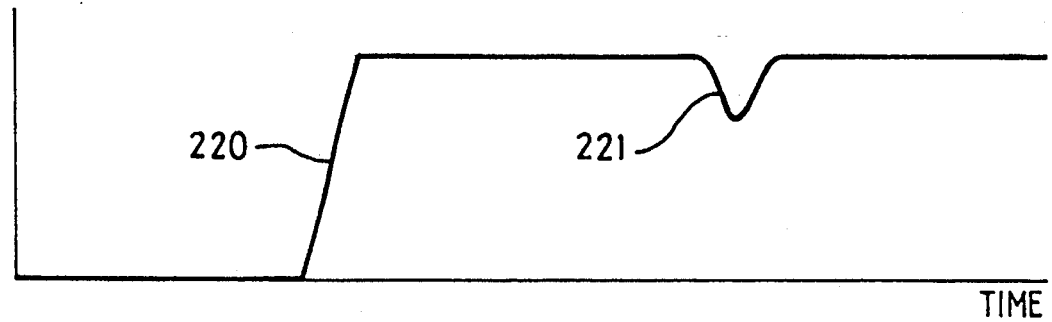
Fig. 6(a)
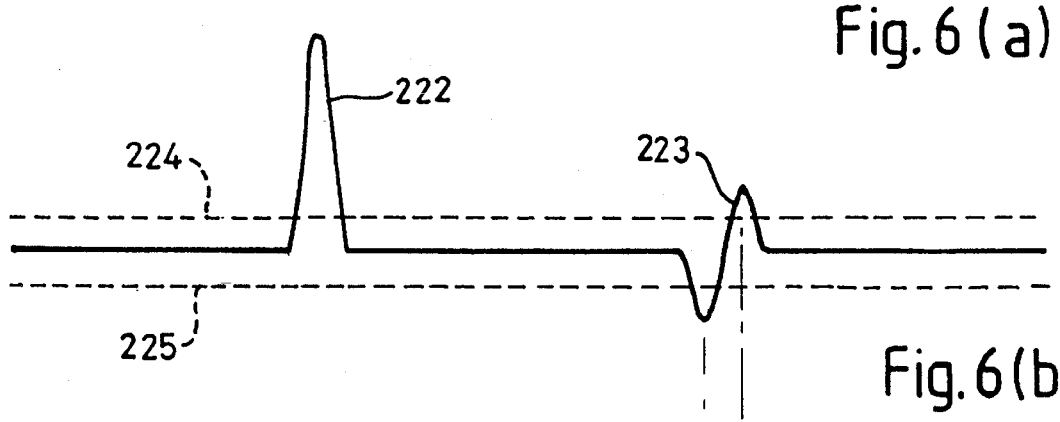
Fig. 6(b)
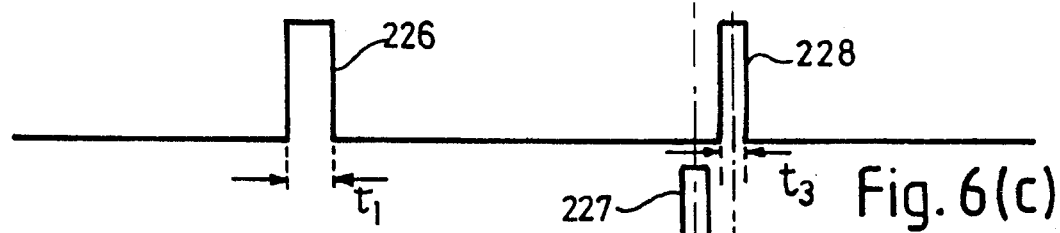
Fig. 6(c)
Fig. 6(d)
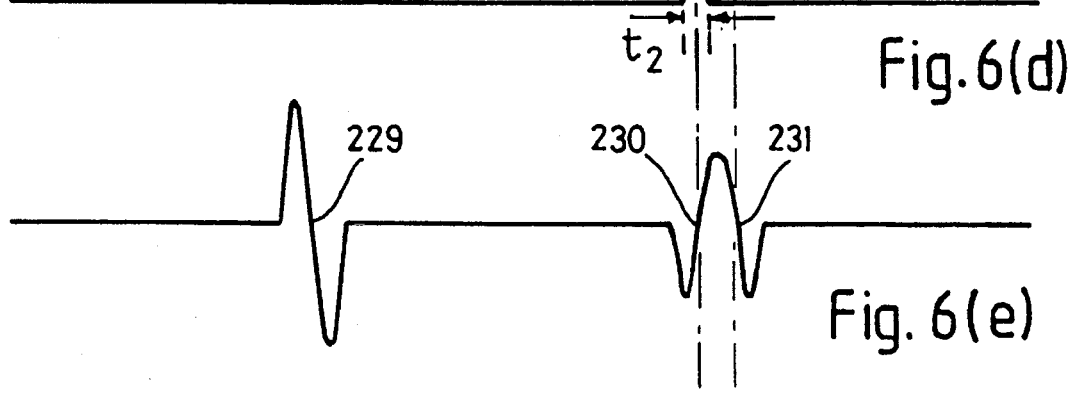
Fig. 6(e)

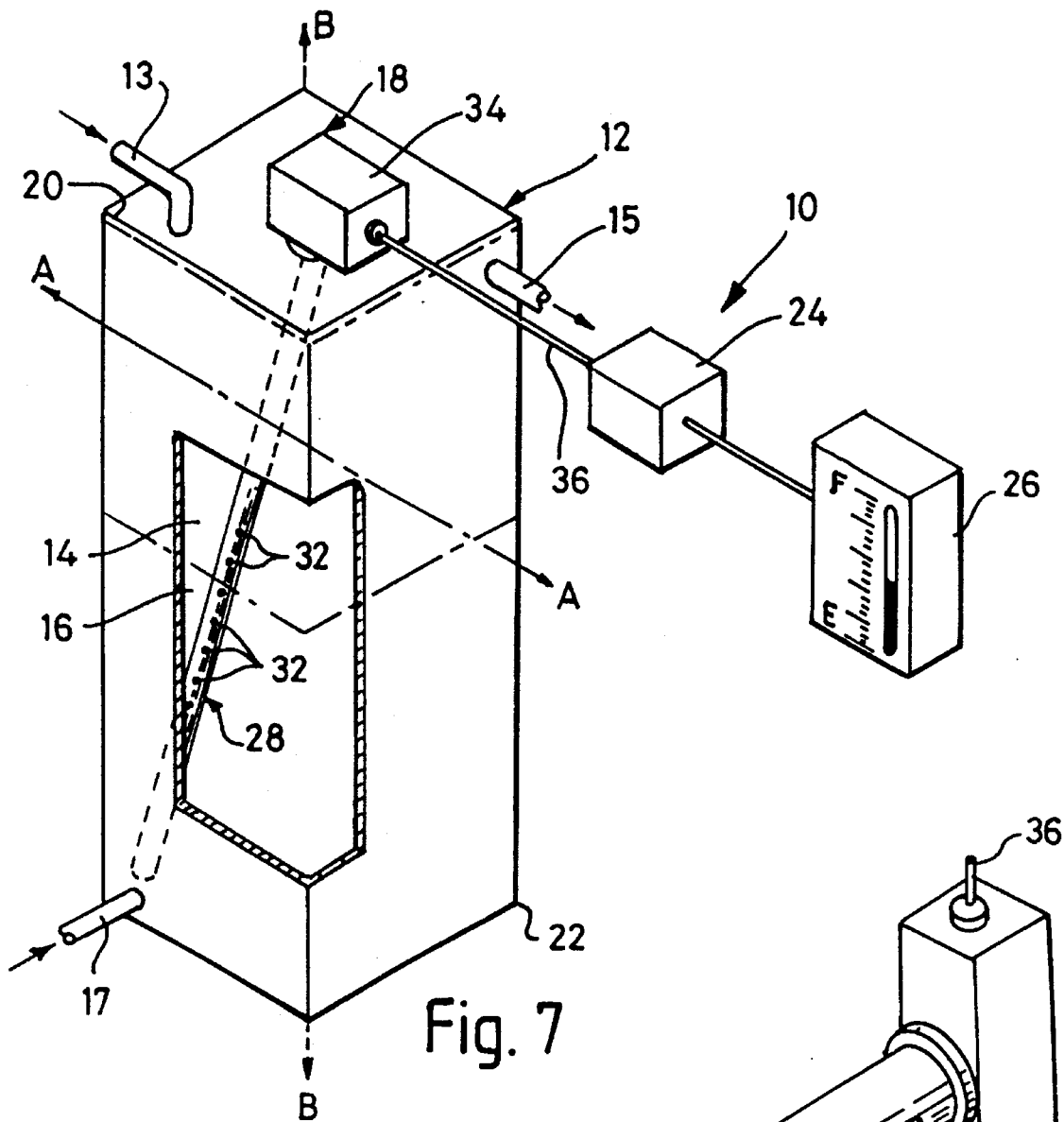
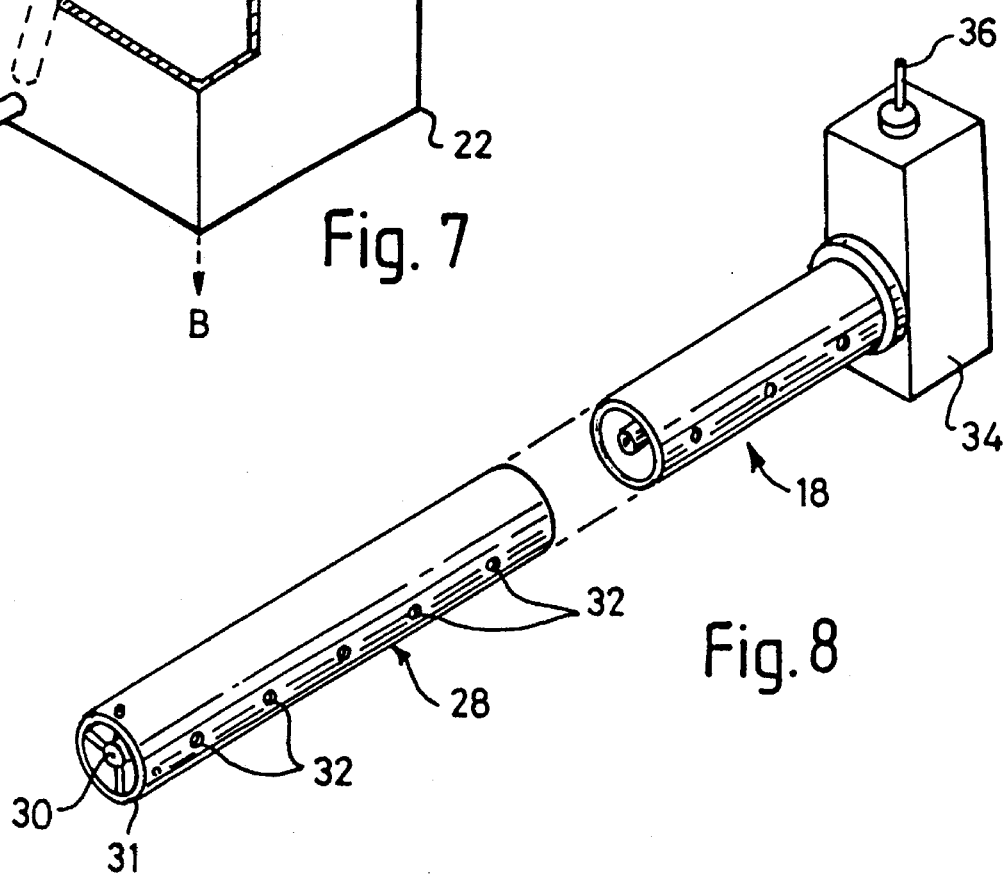
Fig. 7
Fig. 8

METHOD AND APPARATUS FOR DETERMINING A FLUID LEVEL IN THE VICINITY OF A TRANSMISSION LINE

BACKGROUND OF THE INVENTION

This application is a continuation of U.S. patent application Ser. No. 08/153,483, filed Nov. 16, 1993, abandoned, which is a continuation of U.S. patent application Ser. No. 07/878,754, filed May 5, 1992, abandoned, which is a continuation-in-part of U.S. patent application Ser. No. 07/777,383, filed Dec. 3, 1991, abandoned, which is the U.S. national phase of PCT application No. PCT/GB90/00930.

FIELD OF THE INVENTION

The invention relates to transmission lines and more specifically to a method of detecting or analysing an object or other discontinuity in the vicinity of a transmission line.

It is known to use a transmission line to determine the level of an interface between fluids in a container. A pulsed electrical signal is applied to the transmission line, which is immersed in the fluids. The electrical signal is reflected as a result of the change of impedance of the line caused by the interface. Given the velocity of propagation of the transmitted signal along the transmission line, the position of the interface can be ascertained from the delay between the application of the transmitted signal and the reception of the reflected signal. Such a technique is known as Time Domain Reflectometry (TDR).

U.S. Pat. No. 4,450,434 (Nielsen et al) and UK Patent No 1 351 654 (McFerrin) show that it is also known to use TDR to locate a break in, or a damaged portion of, a transmission line. In addition U.S. Pat. No. 4,394,640 (Ross) proposes that TDR be used to detect the position of solid objects, such as vehicles, travelling alongside a transmission line.

Known TDR techniques rarely yield any more information than the location of a change of impedance of a transmission line. It is an object of the present invention to provide a technique which can be used to locate a change in impedance, and which provides the basis for obtaining further information on the source of the change in impedance.

SUMMARY OF THE INVENTION

According to the invention there is provided a method of detecting or analysing an object or other discontinuity in a medium in the vicinity of a transmission line, the discontinuity being such as to cause reflection of a signal transmitted along the transmission line, the method comprising the steps of:

a) transmitting a signal along the transmission line;

b) monitoring the transmission line for any reflections of the signal;

c) generating an analysis window of time if the magnitude of a given characteristic of the reflected signal is greater than a threshold value; and d) analysing the reflected signal received during the period of an analysis window to provide the required information on the discontinuity.

The level of a threshold corresponding to a given reflection may be set at a predetermined fraction of the magnitude of a peak of the given characteristic of that reflection.

Preferably the duration of the analysis window corresponds to the length of time during which the magnitude of said characteristic is greater than said threshold.

The given characteristic may, for example, be the amplitude of the reflected signal, but is preferably the differential of the reflected signal with respect to time.

The required information may be an indication of the position along the transmission line of the discontinuity, in which case the analysis of the reflected signal comprises determining a reception time at which a given point on the reflected signal is received, said indication being obtained from a calculation of the time delay between a start time, when the transmitted signal is applied to the transmission line, and said reception time.

Where said part of the reflected signal corresponding to the discontinuity gives rise to only one analysis window, the given point on the reflected signal is conveniently determined by differentiating the latter with respect to time and ascertaining the time at which the differential is at a predetermined value.

Where the reflected signal gives rise to more than one analysis window the point on the reflected signal is preferably determined by taking the second differential with respect to time of the reflected signal, and finding an average of the respective times in the analysis windows when the second derivative is at a predetermined value by an appropriate process.

The pre-determined value of the second derivative may be zero.

If more than one analysis window is created by the reflected signal, an indication of the extent of the discontinuity is obtained by ascertaining the spread of times at which the second differential is at a predetermined value, in the respective analysis windows.

An initial reflected signal may be created as a result of the transmitted signal being reflected at the junction between the transmission line and a cable feeding the transmitted line, and this reflected signal may give rise to an analysis window. In such a case the start time is preferably determined by differentiating the initial reflected signal with respect to time, and ascertaining the time at which the second differential is at a predetermined value.

The order of differentiation of the signal which constitutes the given characteristic, and the order of differentiation of the reflected signal received during an analysis window, may be selected according to the nature of the applied signal or the characteristics of the discontinuity.

Thus, depending on the shape of the applied signal and the characteristics of the discontinuity, the given characteristic of the signal may be the second or higher differential with respect to time, whilst the analysis of the reflected signal received during an analysis window may involve taking the first, second, or higher differential of the reflected signal with respect to time.

BRIEF DESCRIPTION OF THE DRAWINGS

The invention will now be described, by way of example only, with reference to the accompanying drawings in which:

FIGS. 6(a)–(e) show diagrammatically, the analysis of the signals received by the apparatus shown in FIG. 5.

FIG. 7 is a perspective partially cut away view of a fuel tank which contains apparatus for monitoring fuel level using a method according to the invention;

FIG. 8 is a perspective view of a sensing probe forming part of the fuel level monitoring apparatus;

DETAILED DESCRIPTION

Figure 1:
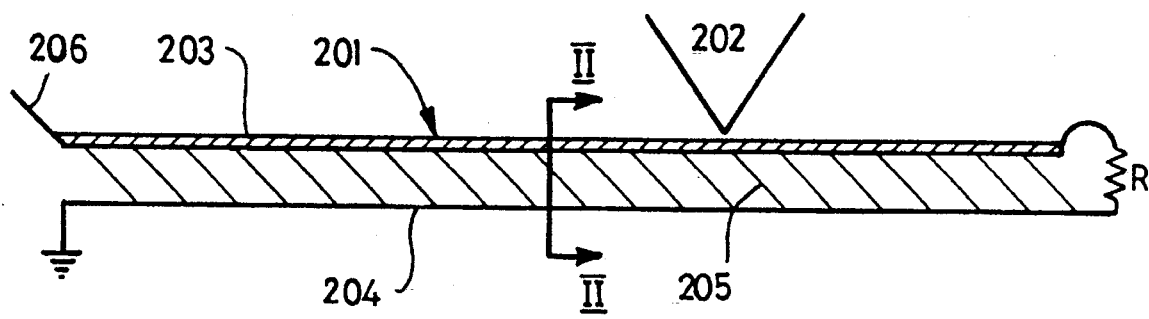
FIG. 1 is a side view of a transmission line for use in a method according to the invention, and a discontinuity in the form of a solid object.
Figure 2:
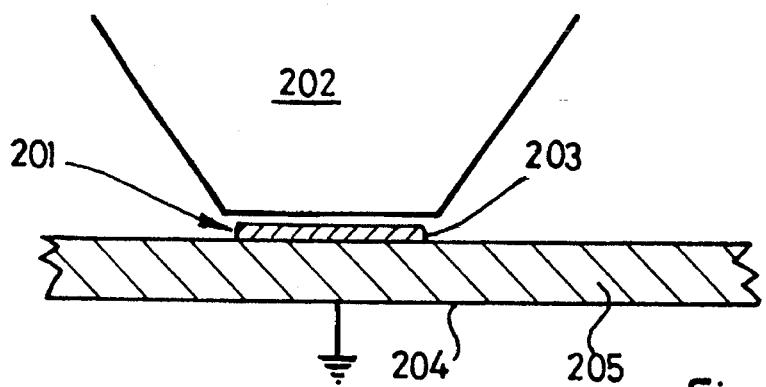
FIG. 2 is a sectional view taken along the line II—II of FIG. 1.

Referring to FIG. 1, a transmission line 201 is used to detect or analyse an electrical discontinuity caused by the proximity of an object 202 to obtain information on the latter.

The transmission line 201 comprises an elongate conducting element 203 separated from a ground plane 204 by a dielectric spacer 205. The transmission line is terminated at one end by a resistor R which is connected between the conductor 203 and the ground plane 204, and which has a resistance substantially matching the impedance of the transmission line 201.

Figure 3:
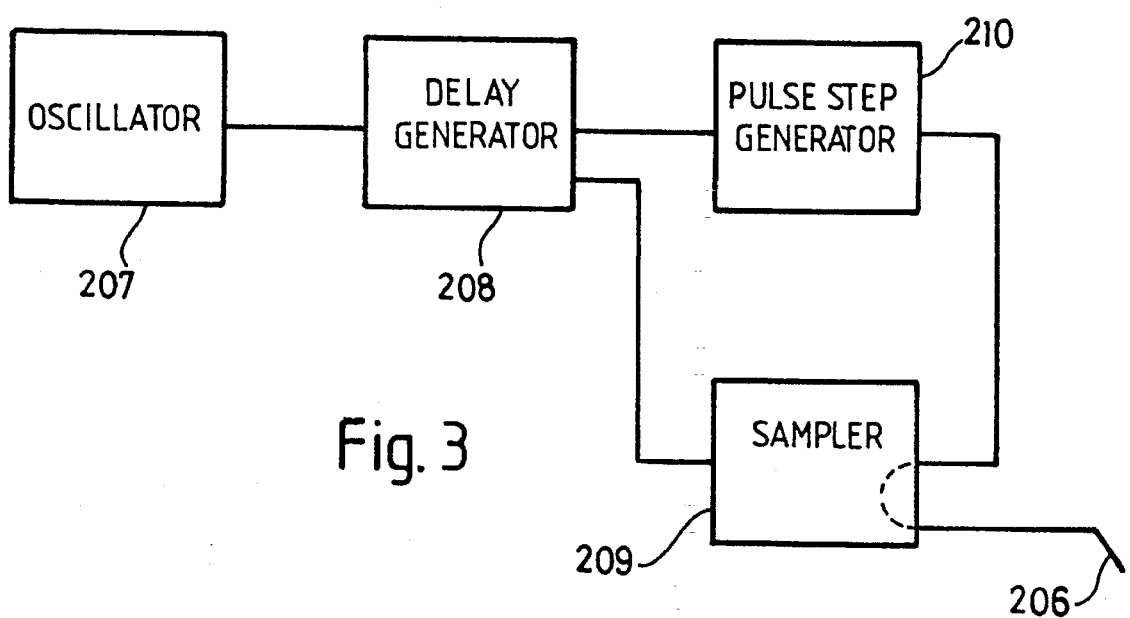
FIG. 3 is a block circuit diagram of apparatus for generating signals to be applied to the transmission line.

An input or feed cable 206 is connected to the conductor 203 at the other end of the transmission line 201, and is also connected to signal input apparatus shown in FIG. 3. In the signal input apparatus, an oscillator 207 is connected via a delay generator 208 to a sampler 209. The delay generator 208 is also connected to a pulse step generator 210 which is connected in parallel to the sampler 209. Both the sampler 209 and the generator 210 are connected to the cable 206.

In use, the oscillator 207 feeds a square wave signal having a frequency of 1 MHz into the delay generator 208 where the signal is split into two components. The first component is also a 1 MHz square wave signal which is relayed to the pulse step generator 10 which is triggered by that component to generate a succession of step signals at a frequency of 1 MHz.

Figure 4:
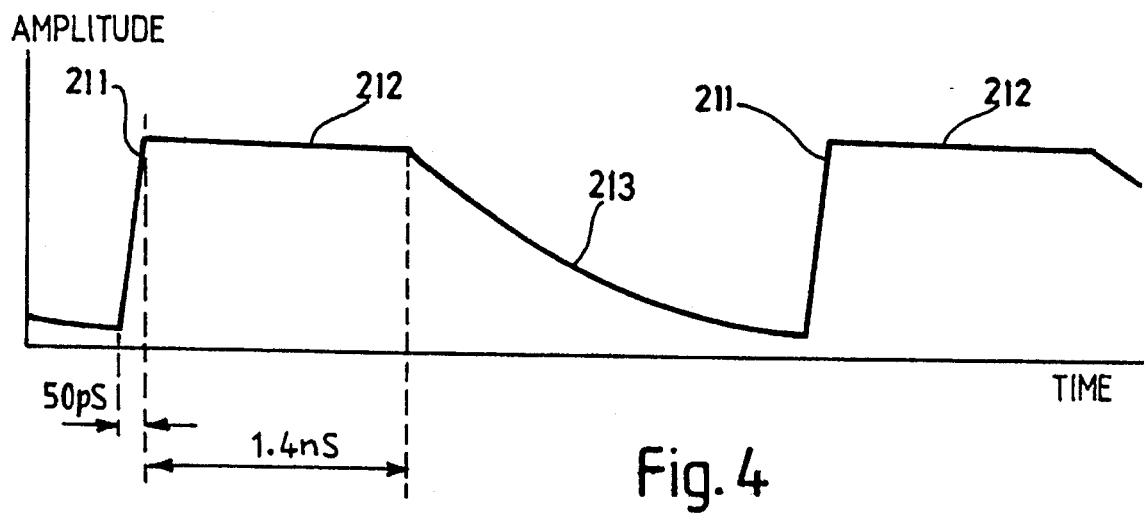
FIG. 4 is a graph of the signals applied by the apparatus shown in FIG. 3.

The signals produced by the generator 210 are shown in FIG. 4. Each input signal comprises an initial step 211 having a duration of approximately 50 ps, a plateau 212 of around 1–4 ns and a gradual decay 213. The duration of the plateau 212 corresponds to the length of the transmission line 201 so that, when a input signal is applied to the transmission line 201 at input 206, the portion of the plateau adjacent the step 211 will have reached the end of the transmission line, by the time the input signal begins to decay at the input 206.

The other component of the original 1 MHz signal is processed by the delay generator 208 to give a signal having a frequency of slightly less than 1 MHz, for example 0.9999 MHz. This reduced frequency signal is relayed to the sampler 209, which is consequently triggered to sample the input 206 for any reflected signals returning along the transmission line 201, at the frequency of the reduced frequency component.

Figure 5:
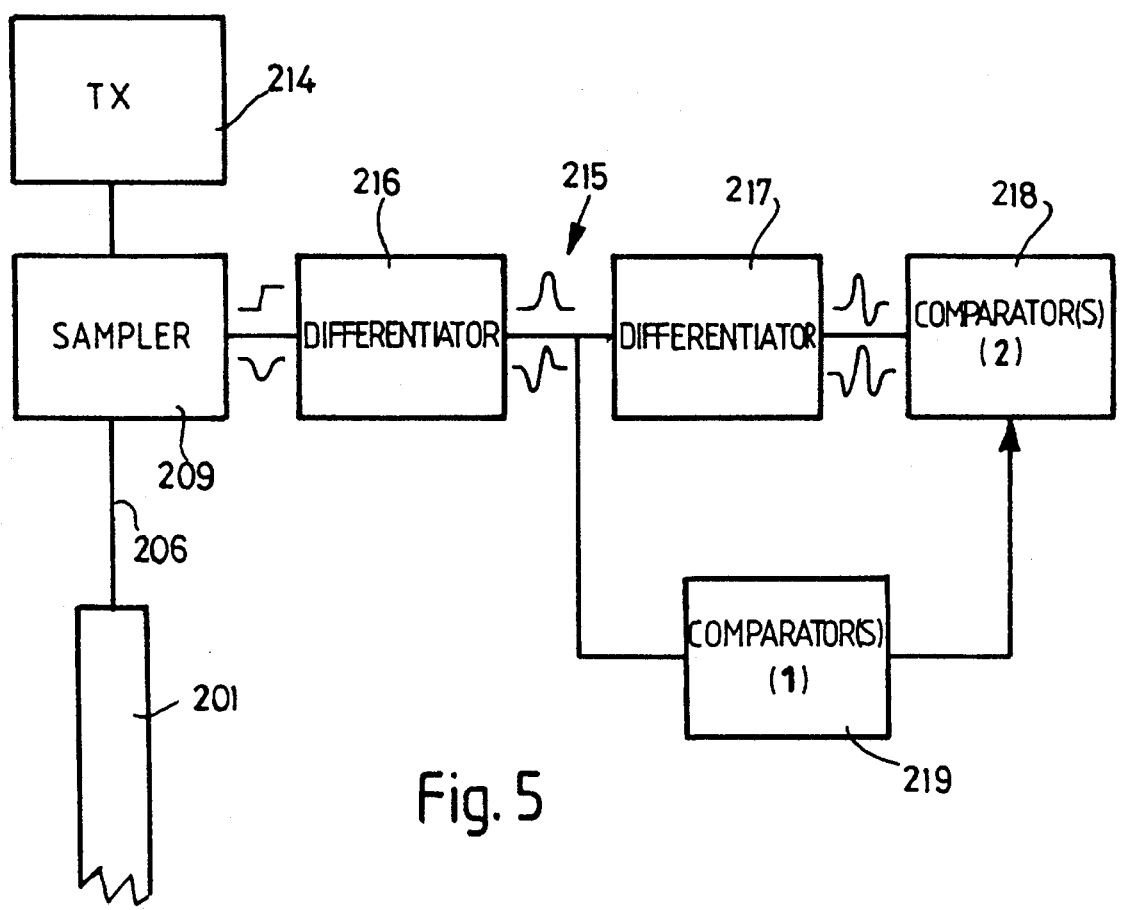
FIG. 5 is a block circuit diagram of apparatus for receiving and processing reflections of the signals which have been transmitted by the apparatus shown in FIG. 3.

In FIG. 5, the oscillator 207, delay generator 208 and generator 210 are indicated by the box referenced 214 connected to the sampler 209. Input signals generated by the pulse step generator 210 are relayed directly to the input 206 through the sampler 209, the output of which is connected to signal processing circuitry 215, which comprises a first differentiator 216, a second differentiator 217 and comparator circuitry 218 connected in series. Further comparator circuitry 219 is connected between the output of the differentiator 216 and the comparator circuitry 218, in parallel with the differentiator 217.

FIG. 6(a) represents the reflection produced by a single input signal applied to the input 206. When the input signal is applied to the transmission line, there will be an initial reflection, caused by the change in impedance, at the junction between the input cable 206 and the line 201, giving rise to an initial step 220. The object 202 is the source of a discontinuity in the medium surrounding the line 201, and this discontinuity leads to further changes in the impedance of the line in the vicinity of the object 202. Thus, as the step of the input signal travels towards and past the object 202, further reflections of the signal will occur, giving rise to the trough 221 in the reflected signal. The time delay between the step 220 and the trough 221 is indicative of the position along the line of the object 202, whilst the duration (ie width) of the trough is related to the physical extent of the object along the line.

In use the sampler 209 samples a portion of each of a succession of reflected input signals, each being sampled at a slightly later time from its respective initial step than the previous input signal since the sampler 209 is triggered at a frequency slightly less than 1 MHz. Each sample will represent a given position on the line from which a reflection would occur if present in that sample. Thus the sampler 209 effectively scans the length of the transmission line 1, and constructs a reflection profile corresponding to the graph shown in FIG. 6(a), which is fed to the differentiator 216 which differentiates the signal of FIG. 6(a) with respect to the time. FIG. 6(b) represents the output of the differentiator 216 which produces a first single polarity pulse 222 corresponding to the step 220 and a second, double polarity pulse 223 corresponding to the trough 221.

The output of the differentiator 216 passes into comparator circuitry 219 and into the second differentiator 217. The comparator circuitry 219 determines whether the magnitude of the signal generated by the differentiator 216 is greater than a positive threshold 224 or less than a negative threshold 225, and if it is, generates an analysis window of time, as shown in FIGS. 6(c) and 6(d), of a duration which corresponds to the time during which the signal is greater than the threshold 224 or less than the threshold 225. Thus three time windows 226, 227 and 228 are generated over respective times $t_1$, $t_2$ and $t_3$, one for the peak 222, and one for each respective peak of the pulse 223. The output signals generated by the comparator circuitry 219 act as enable signals for the comparator circuitry 218.

The differentiator 217 performs a second differentiation with respect to time of the signal generated by the differentiator 216, producing the signal shown in FIG. 6(e). This signal is fed to the comparator circuitry 218, which generates a signal when the second differential is zero, and when an enabling signal is being generated by the comparator circuitry 219. Thus the comparator circuitry 218 determines when the second differential of the original signal is zero within each respective window in times $t_1$, $t_2$ and $t_3$, ie at times 229, 230 and 231 respectively.

The output of the comparator circuitry 218 is relayed to further processing circuitry (not shown), which calculates the average of the times 230 and 231 and the delay between that average and the time 229 to give an indication of the distance along the transmission line 201 of the object 202.

The further processing circuitry may in addition perform further analysis of the signal produced by the comparator circuitry. For example, the further processing circuitry may evaluate the delay between the time when the second differential of the original signal is zero in the window 226, and that when the second differential is zero in the window 227 to give an indication of the extent of the object 202 in the direction of the transmission line 201.

Alternatively, having ascertained the position of the object 202 along the transmission line 201, the further processing circuitry may so control the sampler as to cause the latter to sample the reflected signal at 1 MHz, at the time when the trough 221 is at a minimum (ie the average of the times 230 and 231. If the object 202 is then moved perpendicularly towards the transmission line 201 a plot of the change in amplitude of the trough 221 against time is obtained.

For a given velocity of approach, such a plot for a metallic object will be distinguishable from that obtained from a dielectric object, and it can therefore be determined whether the object is a metallic or a dielectric object.

If the object makes contact with the transmission line 201, and the dielectric spacer 203 is resiliently flexible, the depth of the trough 221 may be analysed in a similar way to give an indication of the pressure of contact between the object 202 and the line 201 if the object 202 is metallic.

Other information which may be derived includes distance from the transmission line of the object causing the discontinuity, the material content of the object, its shape or extent or its movement or slippage against the transmission line, or its separation from a second object. In these cases known characteristics of the object are used to interpret the signal and deduce unknowns.

Such information may be determined by selecting "range windows" from the composite reflected signal, and subjecting the signals observed in those windows to analysis.

The electrical signal may take the form either of a short pulse or a step, and the exact analysis technique will depend on the choice of signal. If a step wave form is used, such range windows may be defined by determining the time during which either the signal value itself or the first derivative of the signal with respect to range exceeds a given value. For a pulse, the amplitude of the signal itself rather than its derivative is used. In the following sections, a step waveform will be assumed.

During each window, various functions of the signal are generated, and derived characteristics of the signal are measured. The functions include the first and second derivatives with respect to range. The derived characteristics include:

(a) The time at which the first or second derivative passes through a defined value which may be zero or may be determined by previous analysis of signals received in the absence of external objects.

(b) The value of the signal at the time determined in (a) from the first derivative.

(c) The value of the first derivative at the time determined in (a) from the second derivative.

(d) The rate of change with time of the value determined in (b) or (c).

(e) The interval between two times as determined in (a).

(f) The peak value of the reflected signal during the interval defined in (e).

Each time (a) is used to determine the location along the transmission line of an edge or an object.

If its material is unknown, the rate (d) is measured when the transmission line is moved laterally towards the object at a known constant rate. This allows the object to be identified as metallic or non-metallic, and may allow inference of its dielectric constant.

The interval measured in (e), based on times arising from the second derivative in (a), indicates the extent of the object for certain shapes.

If its material is known or constrained, and its extent has been determined as greater than a known minimum, its proximity may be deduced from the value determined in (f).

Motion of the object along the transmission line can be measured as changes with time of the value determined in (a), and slippage or vibration at a known location can be detected from changes in the value determined as in (b) or (f).

High-frequency vibration or scraping can be monitored by changing the mode of operation of the sensor to monitor only signals at the known location.

If a compliant dielectric substrate is used, the force between the object and the transmission line can be measured from the value determined in (b) or (f).

One of the applications for the invention is the measurement of fuel level in the fuel tank of, for example a ship, and an assembly for doing this is shown in FIGS. 7–11.

That assembly 10 is for use in measuring the level of fuel 14 in a tank 12 and replaces the float sensors in Navy ship fuel tanks. In the environment of Navy ships, ballasting is provided by pumping in saltwater 16 as the fuel is used (and the fuel level decreases) to retain liquid within the tanks 12.

The tank 12 includes a fuel inlet 13 for filling the tank 12 with fuel 14, a fuel outlet 15 for pumping fuel 14 to the ship engine, and saltwater port 17 for pumping saltwater 16 into and out of the tank 12.

The assembly 10 includes sensor means 18 connected with the tank 12 between the top 20 and bottom 22 thereof for transmitting an electrical pulse and for producing a reflected waveform indicative of impedance change points.

Processor means 24 produces the electrical pulse transmitted down the sensor means 18 and receives the reflected waveform to produce a level signal indicative of the level of fuel in the tank 12. Display means 26 receives the level signal and visually indicates the absolute level of fuel in the tank 12.

The sensor means 18 includes a probe 8 of dual concentric conductor configurations that functions as a high frequency transmission line. An electromagnetic pulse is transmitted over the inner conductor 30. The pulse travels the inner conductor 30 with a returning reflection or "ping" caused by a fluid interface, which occurs due to impedance change points. Multiple reflections or "pings" are caused by multiple fluid layer interfaces. The balance of the pulse is reflected at the bottom of the probe 28. The probe 28 is mounted the depth of the tank 12 in an angled configuration between horizontal A and vertical B axis. Openings 32 in the outer conductor 31 allow fluid to flow freely within the probe annulus. Variations of the coaxial probe configuration 28 are provided for specific fluid environments. Other configurations may include flexible probe and nonfluid contact probes. The intrinsic simplicity of the dual conductor probe 28 configuration lends itself to a wide variety of fluid and tank 12 applications. In general, probe configuration permits deep tank applications.

Depending on the fluid, use of the probe in a tank 12 of thirty meters depth are possible. The probe 28 has no moving parts and therefore requires less maintenance and provides increased system reliability.

Reflections are provided at the top 20 of the tank 12, air and fuel 14 interface, fuel 14 and saltwater 16 interface, and at the bottom 22 of the tank 12. The probe 28 includes connection means 34 for producing a change of impedance point at the top 20 of the tank 12. In the preferred embodiment, the pulse is transmitted along a 50 Ohm conductor cable 36 connected to the probe 28, having 75 ohm characteristic. At this change of impedance point, a negative going spike will occur in the reflection waveform.

Figure 9:
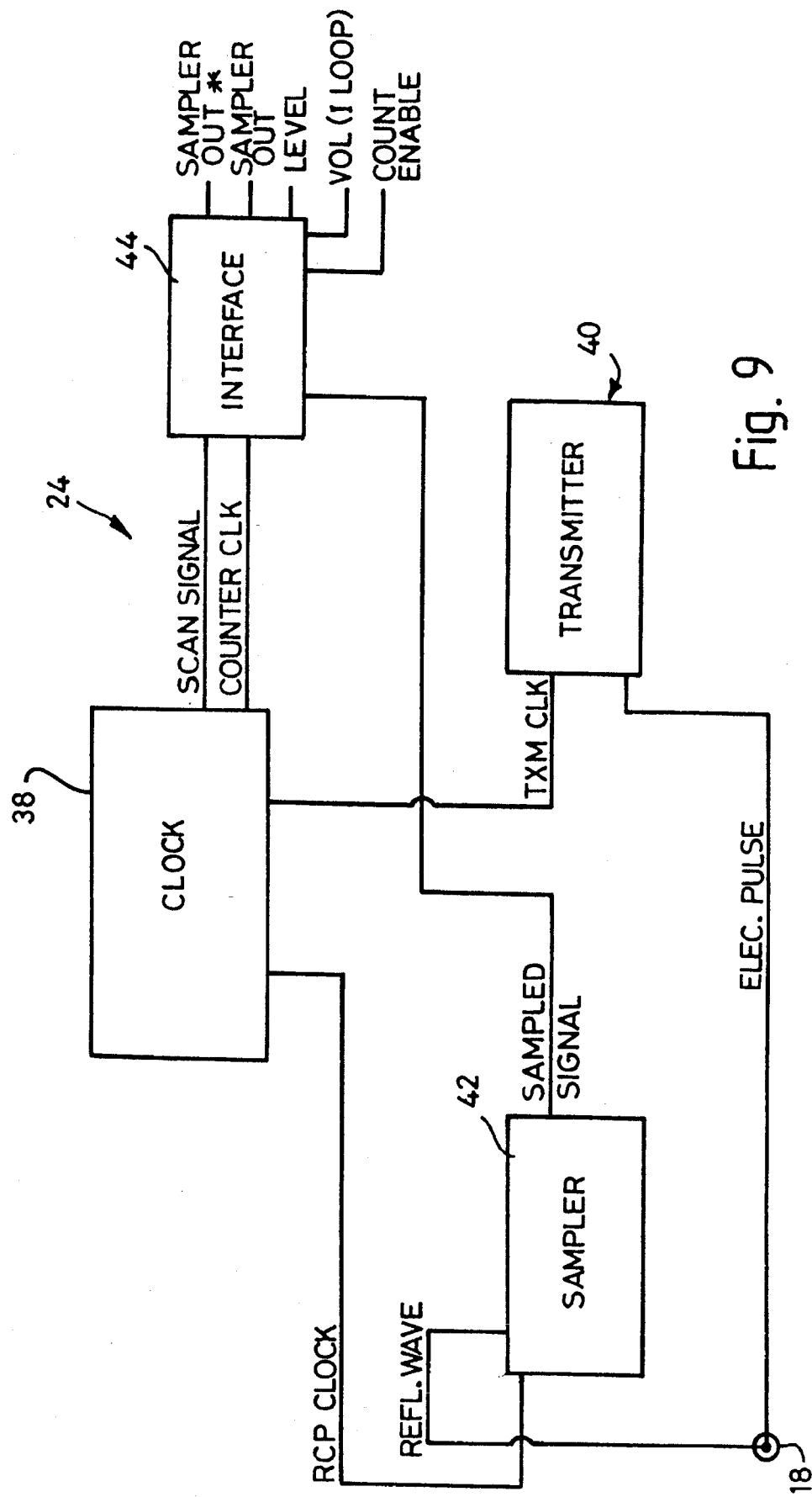
FIG. 9 is a general block diagram of processor means which form another part of the fuel level monitoring apparatus.

As illustrated in FIG. 9, the processor means 24 includes clock means 38 for providing timing signals to generate the electrical pulse and to receive the reflected waveform. The clock means 38 produces a transmission clock signal for the timing of the electrical pulse and the sampling or scanning of the reflected signal for determination of the level. The processor means 24 also includes transmitter means 40 for receiving the transmission clock signal from the clock means 38 and for transmitting the electrical pulses to the probe 28. The processor means 24 includes sampling means 42 for receiving the reflected waveforms from the probe 28 and producing a sampled signal indicative of the reflected waveform. Interface means 44 receives the sampled signal and processes the signal to produce an output indicative of the level of the fuel in the tank 12 for the display means 26.

Figure 10A:
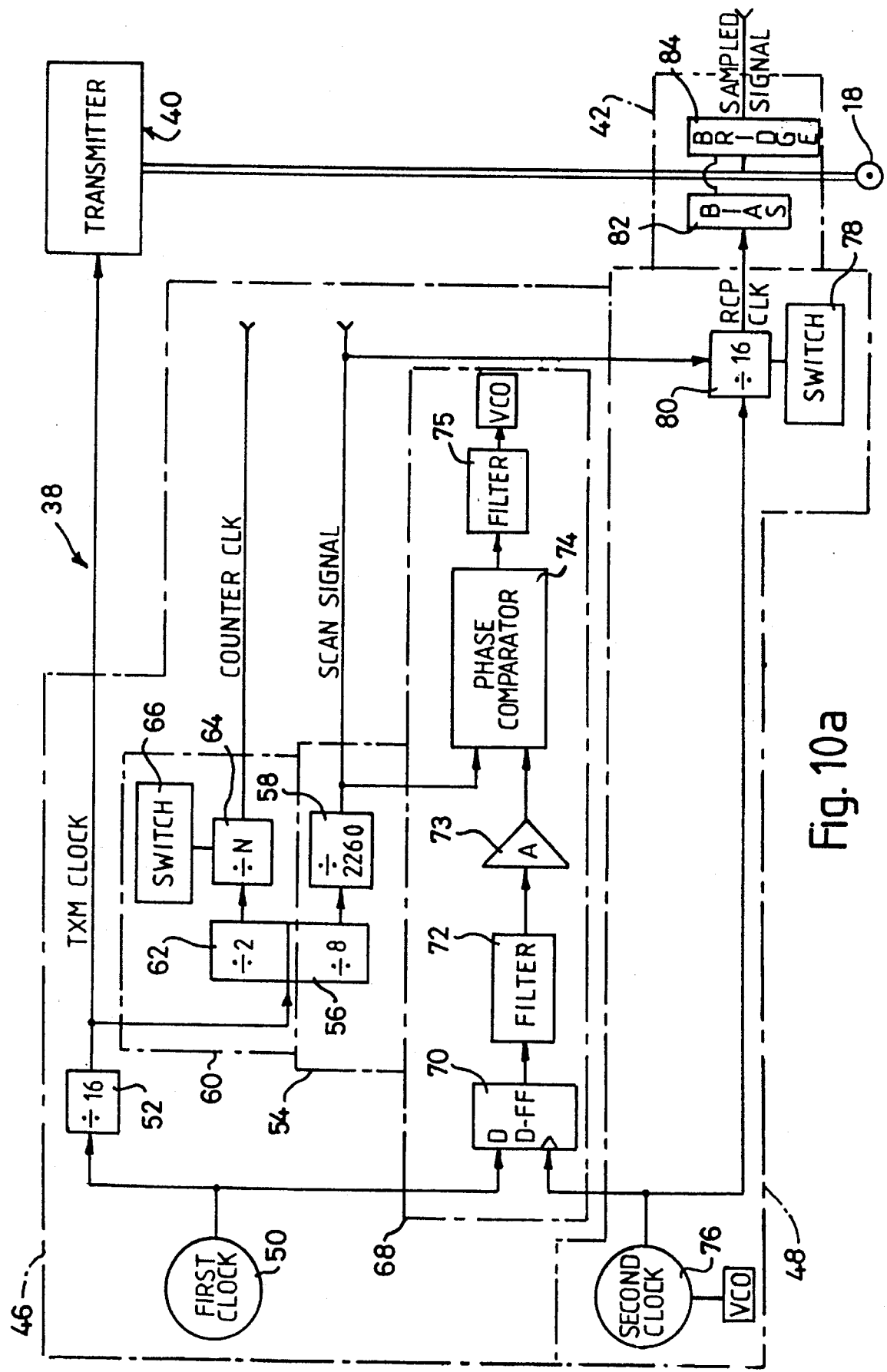
FIGS. 10a–b are more specific block diagrams of the processor means.

FIG. 10a illustrates the more specific block diagram of the clock means 38 in relation to the transmitter means 40 and sampling means 42. The clock means 38 includes transmission generation means 46 for producing the transmission clock signal and delay means 48 for producing the reception clock signal.

The transmission generation means 46 includes transmission clock means 50 for producing a first clock signal having a predetermined frequency. Transmission divider means 52 receives the first clock signal and divides the predetermined frequency to produce the transmission clock signal, which is fed to the tranmitter means 40 and scan means 54.

The scan means 54 includes a divide-by-eight circuit 56 and a divide-by-2260 circuit 58 to provide the 110 Hz scan signal. Scaling means 60 receives the transmission clock signal and produces a counter clock signal which is required to scale the returning pulse reflection. More specifically, the scaling means 60 includes a divide-by-two circuit 62 and a divide-by-N circuit 64 producing the counter clock signal. The divide-by-N circuit 64 is set by time resolution means 66 comprising a plurality of switches for setting the time resolution of the output.

The transmission generation means 46 includes a phase locked means 68 for phase locking the reception clock signal to the transmission clock signal. The phase locked means 68 includes a flip flop 70 for receiving the first clock signal at its D input and the second clock signal its clock input. The flip flop 70 feeds a filter 72 which is then amplified 73 to produce a beat frequency signal. The beat frequency is received by a phase comparator 74 which also receives the scan signal. The phase comparator 74 ensures phase locking of the signals, which are then filtered by filter 75, and produces a voltage controlled output which is fed to reception clock means 76.

The delay means 48 includes reception clock means 76 for receiving the transmission frequency signal and producing a second clock signal having a preset frequency dependent upon the predetermined frequency. The delay means 48 also includes delay selection means 78 for manually setting the time duration required to capture the reflected waveform, and reception divider means 80 for receiving the selected time and producing the reception clock signal indicative thereof.

The transmitter means 40 receives and amplifies the transmission clock signal, and transmits the electrical pulse to the probe sensor 18. The pulse is generated using fast rise time devices such as step recovery diodes.

Scan means 54, phase locked means 68 and delay means 48 act as a phase locked loop to generate a second clock signal used to trigger the sampling means 42 in such a way that the delay between the transmission of the pulse signal and the sampling of the reflected signal increases linearly with time (with each successive sampling) and results in the generation of a "scan signal" at the completion of the scan of each delay segment (described below).

The sampling means 42 receives and samples the reflected waveform to produce a sampled signal indicative of the reflected waveform. The sampling means 42 includes biasing means 82 for receiving the reception clock signal and producing a bias signal. The sampling means 42 also includes a bridge means 84 for sampling the reflected waveform controlled by the biasing signal producing the sampled signal indicative of the reflected waveform while preventing reception of the electrical pulse.

The sampling means 42 includes high speed sampling circuits of the kind which employ conventional Schotty barrier diodes and high speed pulse generating circuits to sample the input signal. It has been found that the best results are achieved using step recovery diodes to generate high speed pulses and dual diode packages to form a sampling bridge.

Figure 10B:
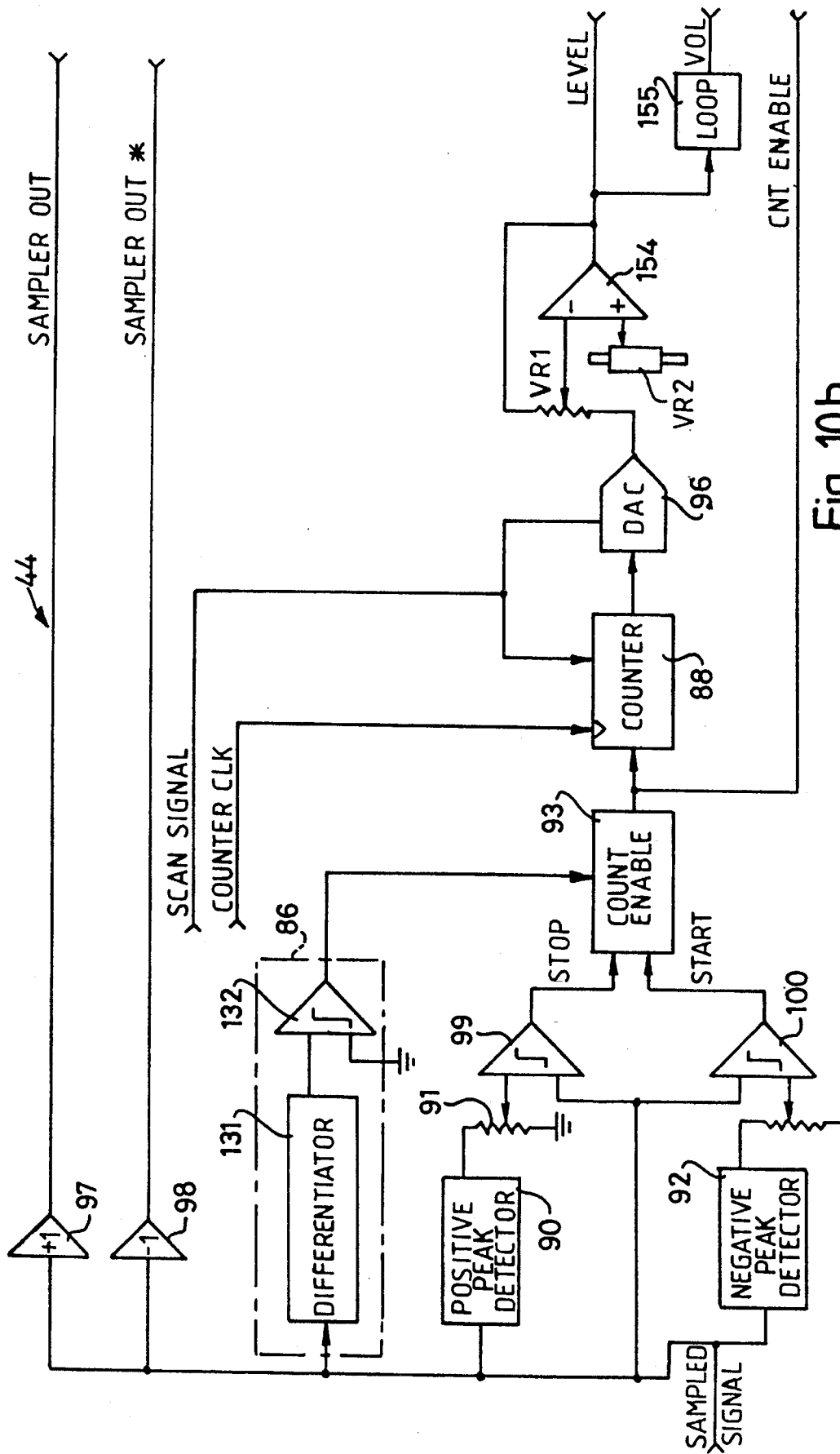

As illustrated in FIG. 10b the interface means 44 receives and converts the sampled signal to a level meter signal indicating the level of fuel in the tank 12 by sensing the difference in time between impedance change points. The interface means 44 includes peak detector means 86 for receiving the sampled signal and producing a drive signal upon the detection of each impedance change point. Also included is a positive peak voltage tracker 90 for monitoring and stoping the peak value of the positive going spike indicative of the saltwater/fuel interface for producing a stop signal indicative thereof. A negative peak voltage tracker 92 which does the same in respect of the negative spike which is indicative of the beginning or top 20 of the tank 12 and produces a start signal indicative thereof. Included is interface counter means 93 for receiving the peak signal, stop signal and start signal for initiating to count time indicative of the level. The interface means 44 also includes conversion means 88 in the form of a digital counter for receiving the drive signal and the scan signal and the counter signal and for producing a digital signal representative of the level of fuel. Also provided is a digital analog conversion means 96 for receiving the digital signal and producing an analog signal representative of the level.

Figure 11:
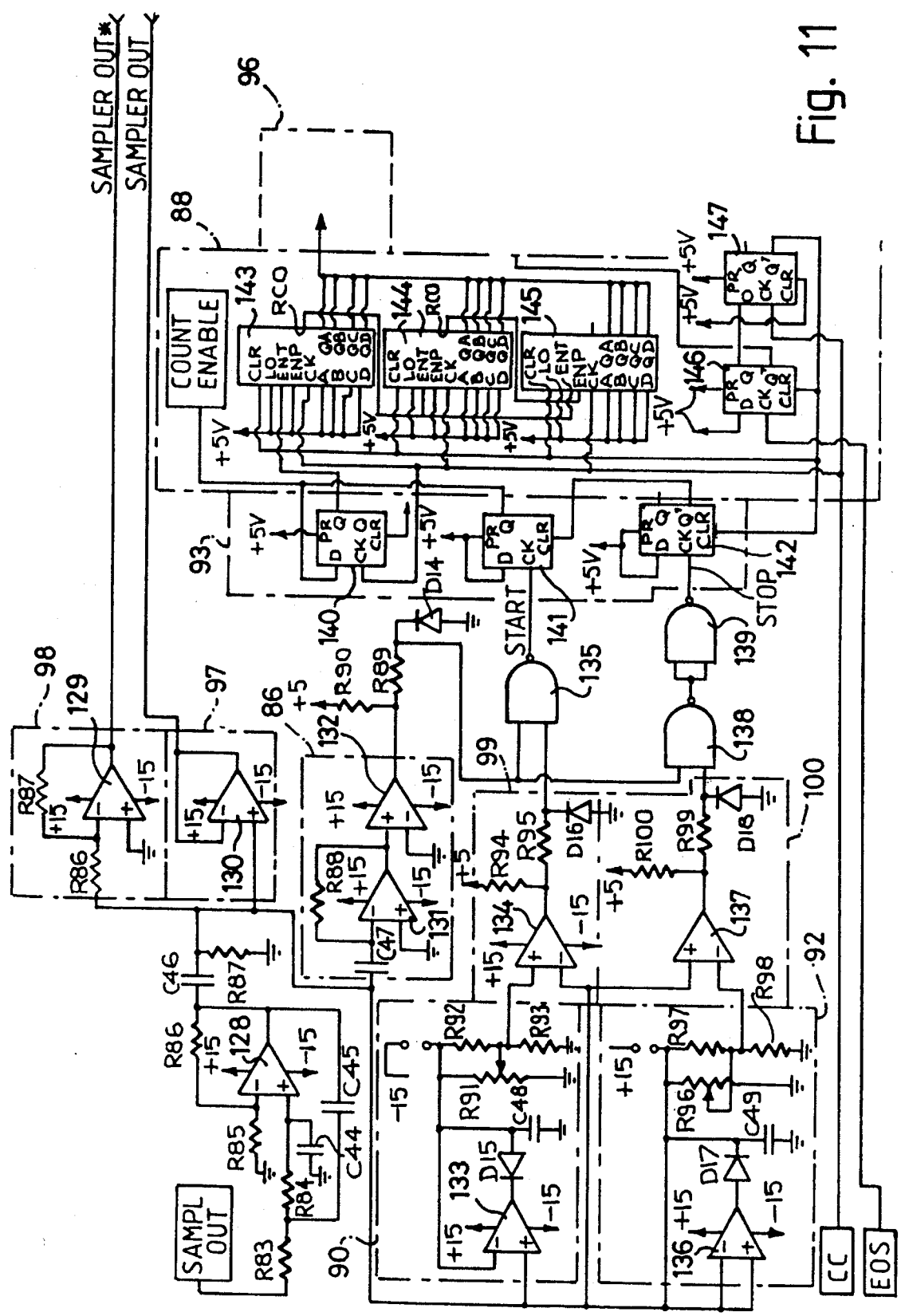
FIG. 11 is a circuit diagram of interface means of the fuel level monitoring apparatus.

The interface means 44 is illustrated in FIG. 11 and receives the sampled signal, counter clock and end of scan signals. The sampled signal is received by an amplifier comprising resistor R83 connected via resistor R84 to the non-inverting input of amplifier 128. The non-inverting input is also connected through capacitor C44 to ground. Feedback is provided through capacitor C45 to the divider between resistor R83 and R84. The inverting input is connected through resistor R85 to ground and as feedback through resistor R86. The output of the amplifier 128 is connected through capacitor C46 to eliminte DC component and through resistor R86 to ground to produce the amplifier signal. The amplified signal is supplied to the peak detector means 86, positive peak voltage tracker 90, and negative voltage tracker 92.

The amplified signal is also supplied to the negative 98 and a positive 97 unity gain amplifiers. The negative unity gain amplifier 98 comprises an operational amplifier 129 receiving the signal through resistor R86 to its inverting input. Feedback is provided to the inverted input through resistor R87, and the non-inverting input is grounded. The operational amplifier 129 provides the positive sample output for testing purposes. The positive unity gain amplifier 97 comprises an operational amplifier 130 receiving the signal at its non-inverting input wherein its inverting input is connected in unity gain feedback to produce the positive sampler output signal for measuring and testing thereof.

The peak detector means 86 comprises a differentiator which receives the amplified signal through capacitor C47 to the inverting input of an operational amplifier 131. The non-inverting input is connected to ground and feedback is provided to the inverting input via the resistor R88. The output of the differentiator is connected to a trigger comprising an operational amplifier 132 connected at its non-inverted input with its inverted input grounded. The output of the operational amplifier 132 is sent through resistor R89 and resistor R90 to positive voltage, and to ground through diode D14 which produces the drive signal.

The positive peak voltage tracker 90 comprises an operational amplifier 133 receiving the signal at its non-inverting input and having feedback to its inverting input to the output via a diode D15. The diode D15 is also connected to ground through capacitor C48. The output signal is connected to a variable resistor R91 to ground and to a voltage divider comprising resistors R92 and R93. The division is supplied to the non-inverting input of a trigger amplifier 134 having its inverting input connected directly to the signal. The output is connected through resistor R94 to positive 5 volt supply and through resistor R95 to ground through diode D15 and through resistor R95 to one input of a NAND gate 135. The NAND gate 135 also receives the drive signal.

The negative peak voltage tracker 92 comprises an operational amplifier 136 receiving its non-inverting input the signal, having feedback provided to the inverting input through diode D17 to capacitor C49 to ground. The output is also supplied to a variable resistor R96 and a voltage divider circuit comprising resistors R97 and R98. A trigger comprises an operational amplifier 137 having its inverting input connected to the voltage divider of R97 and R98 and having its non-inverting input connected to the original signal.

The output of the operational amplifier 137 provides the start signal through resistor R99 which is also connected through resistor R100 to the positive 5 volts supply and diode D18 is connected to ground. The start signal is connected to a NAND gate 138 having its other input connected to the drive signal. The output of the NAND gate 138 is connected to a dual input NAND gate 139 for producing the stop signal.

The interface counter means 94 includes three D-flip flops 140, 141, 142, the first D-flip flop 140 is connected to the count enable signal at its D input with the clock signal connected to the counterclock signal. The second D-flip flop 141 has its D input connected to the positive 5 volts, and the Q output producing the count enable wherein its clock input is connected from the NAND gate 135, and clear is provided from the Q' output of a third D-flip flop 142. The third D-flip flop 142 has its D input connected to the positive 5 volt supply and having its clock input from the stop signal.

A plurality of synchronous binary counters 143-5 (type HC161) with asynchronous clear receives the Q output from the first D-flip flop 143 at its ENT input. The counterclock is received at the clock input of all three synchronous binary counters 143-5. A second pair of D-flip flops 146,147 has a first D-flip flop 146 with the D input connected to 5 volts and the clock signal connected to the end of the scan signal, the Q output is connected to the D input of the second D-flip flop 147 with the clock input connected to the counterclock signal and the Q' input connected to the clear input of the third D flip flop 142. The Q' output is also connected to the clear inputs of the synchronous binary counters 143-5. The LD, ENP, A,B,C and D inputs are connected to positive 5 volts. On the remainder of the synchronous binary counters 143-5, the ENT input is connected to the RCD output from the first binary counter. The outputs provide a 12 bit word which is transmitted to the digital analoge conversion means 96.

In operation, the transmission clock signal establishes the electrical pulse timing, The transmitter 40 receives and amplifies the 2 MHz clock signal producing the electrical pulse to the sensor 18. The reception clock 76 is phase locked to the transmission clock 50 at a frequency offset of 110 Hz by the phase comparator 74. The counter signal is set by the first switch 66 and lies in the range of 62.5 KHz to 1 MHz, which signal scales the returning pulse reflection. In effect, change of the first switch 66 adjusts the length of the receive pulse to sample a shorter or longer returning reflection. The scan signal indicates pulse completion at 110 Hz. The reception clock signal (sampler clock) is required to capture the returning pulse reflection. The reception divider means 80 provides the 2 MHz signal. At the end of each scan, the scan signal resets the counter 80 to a value selected by the second switch 78. The start delay of the reception signal may be adjusted to one of sixteen values throughout the 500 ns range of the 2 MHz transmission signal. Only one of the sixteen delay segments is covered during the scan window. In general, by adjusting switch 78, the reception signal is moved back and forth to sample the returning pulse at a shorter or longer delay from the transmission of the pulse down the sensor 18. For example, a long delay would be desirable if a long transmission cable 36 is used to sample the reflected waveform only in proximity of the impedance change points. The positive 90 and negative 92 peak voltage trackers hold the maximum and minimum values of the waveform using capacitors c48 and c49 respectively. The differentiator 131 and comparator 132 detect the instant of the zero slope or the peak. The outputs of the voltage trackers 90 and 92 respectively define positive and negative threshold levels, each being a predetermined fraction of the respective peak value. When the positive threshold is exceeded, the comparator 134 generates a signal which is relayed to the first input of the NAND gate 135. The gate 135 will relay a start signal to the flip flop 144 if, during the analysis window of time defined by the application of the signal to the first input, a signal is received at second input from the detector means 86. Similarly, the compartor 137 generates a signal which defines an analysis window of time in which a signal from the detector means 86 will result in a stop signal being relayed to the flip flop 142.

Thus the comparators 134 and 137 are operable to control the output of the flip flops 142 and 144 to define a count enable pulse which determines the start and end points of the control pulse. The count enable pulse is used to gate the conversion means 88, which is clocked by the counter clock. The conversion means 88 generates a binary intermediate signal which represents the time separation between the reference reflection (top of tank) and target reflection and which is then converted into a final analogue signal by the conversion means 96. Variable gain and offset amplifier 154 provides the level output which may be calibrated for a particular sensing element. A voltage controlled current source with a 4 mA offset is used to provide the 4–20 mA current loop output.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore to be understood that within the scope of the appended claims the invention may be practised otherwise than as specifically described.

For example, instead of measuring fuel level, the invention could be used in the measurement of the level of other liquids, for example oil, fresh water, waste water aqueous or organic solutions or solids, for example grains powders or sand.

We claim:

1. A method of detecting a fluid level in a tank, comprising inserting into the tank an elongate probe including a transmission line which extends into the tank non-horizontally, transmitting from one end of the transmission line a repetitive electrical signal having a train of transients, monitoring the transmission line from said one end for any reflections of the transmitted signal, generating an analysis enabling signal representative of an analysis window of time if the magnitude of a given characteristic of the reflected signal is greater than a threshold value, said window corresponding to a respective region in the tank, and analysing the reflected signal received during the time of an analysis window to determine the position in the region of a reflection consequent upon the fluid level in the tank, wherein the generation of the analysis enabling signal and the consequent analysis window avoids the need for analysis of reflected signals which lie outside the analysis window.

2. A method according to claim 1, wherein the fluid comprises a fuel.

3. A method according to claim 1 in which the duration of the analysis window corresponds to the length of time during which the magnitude of said characteristic is greater than said threshold.

4. A method according to claim 3, in which the given characteristic is the differential of the signal with respect to time.

5. A method according to claim 1, in which the position of the reflection is determined by calculating the time delay between a start time, when the transmitted signal is applied to the transmission line, and a reception time, at which a given point on the reflected signal is received.

6. A method according to claim 5, in which the given point on the reflected signal is detected by differentiating the reflected signal with respect to time and ascertaining the time at which the differential is at a predetermined value.

7. A method according to claim 6, in which the predetermined value of the differential is zero.

8. A method according to claim 1, in which an initial respective reflected signal is produced as each transient of the transmitted signal is applied to the transmission line, said initial reflected signal being of sufficient magnitude to generate an initial analysis window, wherein the start time is determined by differentiating the initial reflected signal with respect to time, and ascertaining the time at which the differential is a predetermined value, within said initial analysis window.

9. A method according to claim 8, in which the predetermined value is zero.

10. A method according to claim 9, in which the frequencies of transmission of the transients in the transmitted signal and of said sampling are respectively governed by transmitting means controlled by signals derived from a source clock and sampling means controlled by signals also derived from said source clock, the signal for the sampling means being obtained by feeding a signal from said source clock through shift means for changing the frequency of said signal.

11. Apparatus for detecting a fluid level in a tank, the apparatus comprising a probe for insertion into the tank, the probe including a transmission line for extending non-horizontally into the tank, transmission means for transmitting from one end of the transmission line a repetitive electrical signal having a train of transients at a first frequency, monitoring means for monitoring the transmission line from said one end for any reflections of the transmitted signal, the monitoring means including sampling means driven at a second different frequency from the first frequency and operative to detect reflected signals at differing delays after each transmitted transient so that the sampling means repeatedly scans the length of the transmission line for reflected signals, first means for deriving a first characteristic of the reflected signal, first comparator means for determining if the first characteristic has a magnitude greater than a threshold value and for generating an analysis enabling signal representative of an analysis window of time if said magnitude of the given characteristic is greater than the threshold value, second means for deriving a second characteristic of the reflected signal and second comparator means for producing an output which is representative of the second characteristic when the second characteristic is a predetermined value and is within the time window, and processing means which derive from said output the position of the fluid level along the transmission line.

12. Apparatus according to claim 11, wherein the first characteristic is the first differential of the reflected signal with respect to time, the second characteristic is the second differential of the reflected signal with respect to time and the predetermined value is zero.

13. A fuel tank having apparatus according to claim 11, wherein the apparatus is operable to detect the level of fuel in the tank.

14. Apparatus according to claim 11 in which the probe comprises concentric outer and inner conductors spaced from each other so as to define an elongate annular cavity therebetween, the outer conductor being apertured to enable fluid to enter the cavity.

15. A method of measuring the volume of liquid fuel in a tank containing said liquid fuel, an underlying layer of another liquid immiscible with the fuel and a top layer of a fluid, so that the tank contains two interfaces between said layers at levels in the tank which are dependent on the amount of the fuel and of the other liquid present in the tank, the method comprising steps of inserting into the tank an elongate probe including a transmission line which extends into the tank non horizontally, transmitting from one end of the transmission line a repetitive electrical signal having a train of transients, monitoring the transmission line from said one end for any reflections of the transmitted signal, generating analysis enabling signals, defining analysis windows of time, if the magnitude of a given characteristic of the reflected signal is greater than a threshold value, the windows respectively corresponding to different regions in the tank in each of which region a respective interface is situated, analysing the reflected signal received during each window to determine the position in each region, and hence the level, of the respective interface and subtracting the levels of the interfaces to determine the thickness of the fuel layer, and hence the volume of fuel in the tank.

* * * * *